United States Patent
Jones, II et al.

(10) Patent No.: US 6,387,507 B1
(45) Date of Patent: May 14, 2002

(54) HIGH TEMPERATURE CO-FIRED CERAMIC AND LOW TEMPERATURE CO-FIRED CERAMIC COMBINATION ELECTRONIC PACKAGE DEVICE AND METHOD

(75) Inventors: Kenneth L. Jones, II; Robert B. Kunesh, both of Vista, CA (US)

(73) Assignee: Polese Company, Inc., San Diego, CA (US)

( * ) Notice: Subject to any disclaimer, the term of this patent is extended or adjusted under 35 U.S.C. 154(b) by 0 days.

(21) Appl. No.: 09/540,194

(22) Filed: Mar. 31, 2000

(51) Int. Cl.[7] ............................................... B32B 27/38
(52) U.S. Cl. ....................................... 428/416; 428/414
(58) Field of Search ............................... 428/413, 414, 428/415, 416, 417, 418, 901

(56) References Cited

U.S. PATENT DOCUMENTS

| | | | | |
|---|---|---|---|---|
| 5,948,533 A | * | 9/1999 | Gallagher et al. | 428/418 |
| 6,031,729 A | * | 2/2000 | Berkely et al. | 361/771 |
| 6,090,468 A | * | 7/2000 | Shimada et al. | 428/137 |
| 6,145,380 A | * | 11/2000 | MacGugan | 73/493 |
| 6,228,467 B1 | * | 5/2001 | Taniguchi et al. | 428/209 |

* cited by examiner

Primary Examiner—Robert Dawson
Assistant Examiner—Michael J Feely
(74) Attorney, Agent, or Firm—Henri J.A. Charmasson; John D. Buchaca

(57) ABSTRACT

A microelectronic multilayer ceramic package combines a high temperature cofired ceramic (HTCC) module or carrier with a low temperature cofired ceramic (LTCC) module or carrier using a bonding interface layer of electrically non-conductive epoxy having electrically conductive regions for providing electrical interconnection between carriers. The bonding layer also has regions of thermally conductive material for interfacing heat sources on one carrier with heat dissipators on another carrier. The bonding layer also has apertures which allow prominent structures extending from one carrier to pass though and into a corresponding cavity in another carrier.

6 Claims, 1 Drawing Sheet

HIGH TEMPERATURE CO-FIRED CERAMIC AND LOW TEMPERATURE CO-FIRED CERAMIC COMBINATION ELECTRONIC PACKAGE DEVICE AND METHOD

FIELD OF THE INVENTION

This invention relates to microelectronic packaging and more specifically to multilayer ceramic packaging technology for microelectronic components.

BACKGROUND OF THE INVENTION

The microelectronics industry is constantly striving for further miniaturization of components to increase speed and functionality for a given system. This has led to the development of the so-called very large scale integration (VLSI) of a number of electronic components such as integrated circuit chips, discrete components such as inductors, capacitors, resistors, wave guides and fiber optic coupling devices into a single integrated package. The large number of interconnections between the components mounted within the package have driven the creation of socalled Multilayer Ceramic technology (MLC), as described in Microelectronics Packaging Handbook, Van Nostrand Reinhold publishers, New York 1989, pages 455–522 which provides for a thermally efficient, multi-component carrier capable of three-dimensional interconnect circuitry.

In general, fabricating MLC carriers utilizes particles of high temperature withstanding dielectric material such as alumina and glass suspended in an organic binder and formed and dried into so-called "green sheets". Individual sheets of tape are printed with metalization and other circuit patterns, stacked on each other, laminated together at a predetermined temperature and pressure, and then fired at an elevated temperature routine upon which the majority of the binder material vaporizes off while the remaining material fuses or sinters. Where alumina glass is generally used as the insulating material, tungsten, molybdenum or molymanganese is typically used for metalization, and the part is fired at temperatures of about 1,600 degrees C in a reducing atmosphere such as hydrogen. This is known as high temperature co-fired ceramic (HTCC) technology. In a typical HTCC process, screen-printed resistors can be used and only high-melting point refractory metal paste are used as conductors.

The undesirable high processing temperature and requisite hydrogen atmosphere and, more importantly, the limited electrical performance of the high melting point refractory metals has led to the development of low temperature co-fired ceramic (LTCC) technology. Low temperature ceramic tape is commercially available from DuPont Company as a GREEN TAPE brand ceramic tape which sinters at approximately 850 degrees C and exhibits thermal expansion similar to alumina. The low temperature processing permits the use of air-fired resistors and precious metal thick film conductors such as gold, silver or their alloys.

However, due to the large amount of heat generated by the active circuit components and during the fabrication process, thermal management of these packages is a driving concern. Unfortunately, high temperature brazing is unavailable to the LTCC modules.

A discussion of thick film technology, and high and low temperature co-fired ceramic tape technology is found in "Development of a Low Temperature Co-fired Multilayer Ceramic Technology", by William Vitriol et al., ISHM Proceedings 1983, pages 593–598.

In general, HTCC-type packaging is most commonly used for applications requiring high material strength, high thermal conductivity and compatibility for high temperature brazing for mounting lead frames, heat sinks, wave guides and other mounting hardware, and where high conductivity traces are not required. LTCC packaging on the other hand, with its high conductivity silver or gold metalization is commonly used for applications which must route sensitive, typically low-power, high frequency signals, or which require a large number of interconnecting traces. Those designing systems requiring the advantages of both types of carriers would therefore be required to make bulkier separate packages.

SUMMARY OF THE INVENTION

The principal and secondary objects of this invention are to provide a single integrated ceramic package or module which displays the advantages of both high temperature and low temperature cofired ceramic multilayer packages. It is a further object of this invention to provide a mechanism for bonding and interconnecting a plurality of ceramic carriers.

These and other valuable objects are achieved by providing a interconnecting bonding layer comprising both electrically conductive and non-conductive structures for interfacing electrical contact points or pads on the interfacing surfaces of two or more ceramic packages including LTCC and HTCC types. Further, the layer may comprise enhanced thermal conductivity regions for interfacing heat sources with heat dissipating structures. Further, the layer may have apertures to allow passage of prominent structures from one carrier into corresponding cavities in another carrier.

DESCRIPTION OF THE PREFERRED EMBODIMENT OF THE INVENTION

Figure 1:
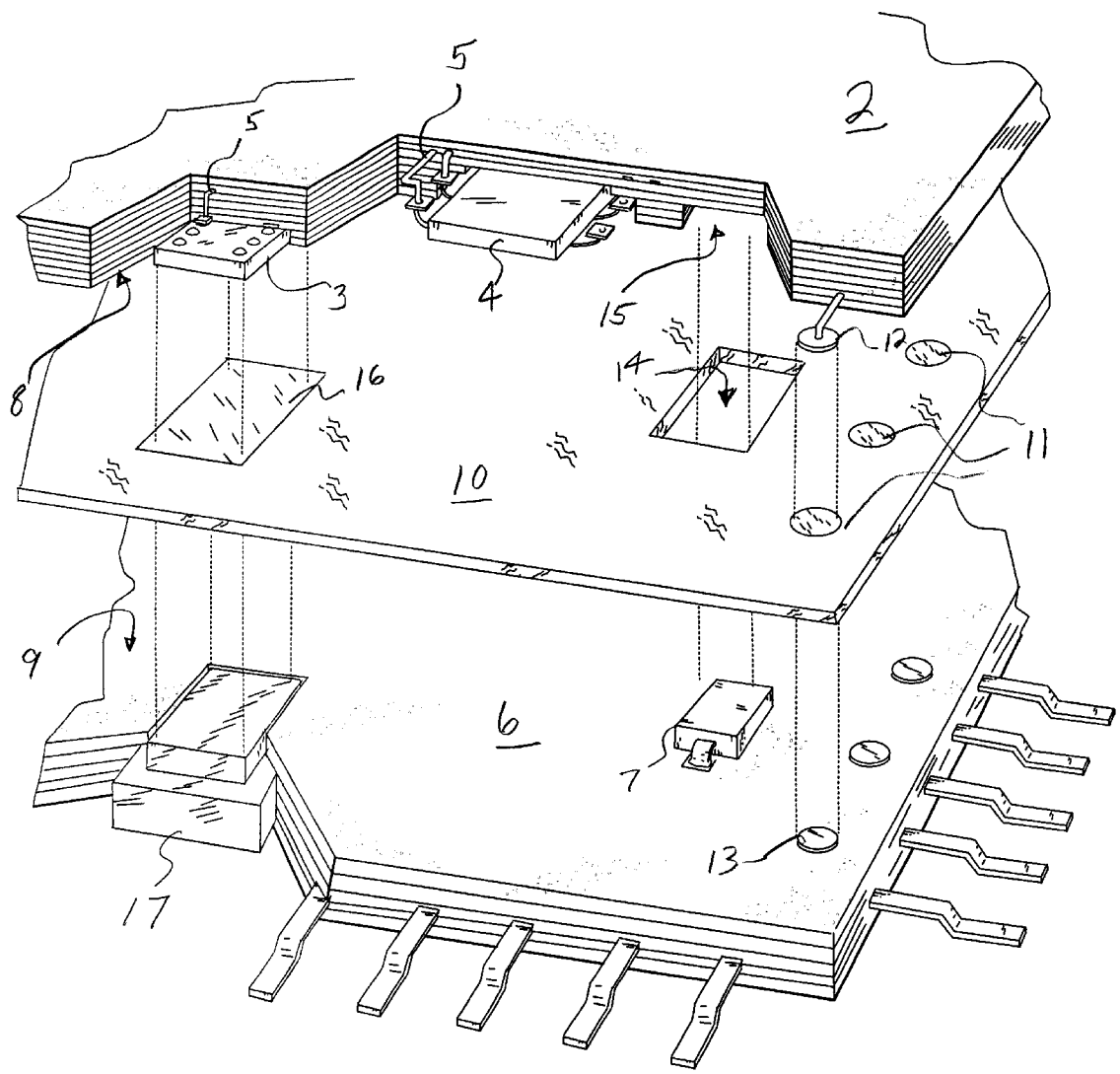
FIG. 1 is a diagrammatic partial cutaway exploded perspective view of a hybrid HTCC/LTCC microelectronic package.

Referring now to the drawing, there is shown in FIG. 1 a matable pair of ceramic carriers. A first upper carrier body 2 is made using low temperature co-fired ceramic (LTCC) processing steps well-known in the microelectronic packaging industry. The LTCC body is structured to mount a number of integrated circuit 3,4 or discrete electronic components and carry high conductivity interconnect metalization 5. A second lower carrier body 6 is made using high temperature co-fired ceramic (HTCC) processing steps well known in the microelectronic packaging industry. The HTCC body is structured to mount integrated circuits or other electronic components such as a capacitor 7 and interconnect using high melting point metalization materials.

The lower contact surface 8 of the upper carrier 2 is shaped to mount upon and rest against the upper contact surface 9 of the lower carrier 6. The halves are bonded by a sheet 10 of bonding material such as epoxy. Preferably, a B-stage type electrically non-conductive sheet is selected. The sheet may then be stamped or punched to form a preform having vias into which are placed electrically conductive material such as metal paste or epoxy doped with electrical conductivity enhancing material such as silver to form conductive regions 11 in the bonding layer. These regions are sized and located to contact corresponding pads 12,13 on the carriers.

An aperture 14 is formed into the bonding sheet 10 to allow for the passage of structures such as the capacitor 7 which extend as a prominence beyond the substantially planar contact surface of a carrier 6 and into a corresponding cavity 15 in the other carrier 2.

In addition, the bonding layer 10 may include a thermal conductivity enhanced region 16 for connecting a heat source such as a flip chip type integrated circuit die 3 located in the top carrier 2 with a heat dissipating structure such as a heat sink 17 in the lower carrier 6.

In this way, sensitive circuit paths such as microwave waveguides or those carrying high frequency signals between integrated circuits may be routed in the LTCC carrier portion of the package having high conductivity metalization. The power and ground paths are run through the HTCC section which also acts as a base for attaching lead frame, heatsinks and other hardware.

While the preferred embodiments of the invention have been described, modifications can be made and other embodiments may be devised without departing from the spirit of the invention.

What is claimed is:

1. A microelectronic ceramic package comprises:

a first high temperature co-fired ceramic body;

a second low temperature co-fired ceramic body;

a bonding layer mating said first body to said second body;

wherein said bonding layer comprises:
an electrically non-conductive portion, and a plurality of electrically conductive portions.

2. The package of claim 1, wherein said electrically non-conductive portion comprises electrically non-conductive epoxy.

3. The package of claim 1, wherein said package further comprises:

each of said bodies bonded to one another along a substantially planar contact surface;

a component mounted upon one of said bodies extending beyond the plane of said contact surface and penetrating into a corresponding cavity in an other of said bodies; and said bonding layer having an aperture sized and located to allow passage of said component therethrough.

4. The package of claim 1, wherein said package further comprises: said first body having a first electrical contact pad located thereon and said second body having a second electrical contact pad located thereon; and wherein said electrically conductive portions comprise: a plurality of electrically conductive slugs embedded into said bonding layer; each of said slugs being located to interconnect said first pad and said second pad.

5. The package of claim 1, wherein said bonding layer further comprises an aperture formed through said layer for allowing passage of a microelectronic component therethrough.

6. The package of claim 5, wherein said microelectronic component is encapsulated by said first and second body and said bonding layer.

* * * * *